US012666599B2

(12) United States Patent
Lu

(10) Patent No.: US 12,666,599 B2
(45) Date of Patent: Jun. 23, 2026

(54) METHOD TO INSULATE CONTACT PLUG WITH SILICON CARBON OXIDE AND TO INSULATE ABOVE BIT LINE WITH SILICON OXIDE BY OXIDATING SILICON CARBON OXIDE

(71) Applicant: CHANGXIN MEMORY TECHNOLOGIES, INC., Hefei City (CN)

(72) Inventor: Zhiyuan Lu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 634 days.

(21) Appl. No.: 18/152,880

(22) Filed: Jan. 11, 2023

(65) Prior Publication Data

US 2024/0008263 A1     Jan. 4, 2024

(30) Foreign Application Priority Data

Jun. 29, 2022     (CN) .......................... 202210759525.8

(51) Int. Cl.
*H10W 70/65* (2026.01)
*H10B 12/00* (2023.01)
*H10W 20/41* (2026.01)

(52) U.S. Cl.
CPC ........... *H10B 12/482* (2023.02); *H10B 12/02* (2023.02); *H10W 20/435* (2026.01)

(58) Field of Classification Search
CPC .... H01L 23/5283; H10B 12/02; H10B 12/482
See application file for complete search history.

(56) References Cited

U.S. PATENT DOCUMENTS

| | | | |
|---|---|---|---|
| 9,123,550 B2 * | 9/2015 | Son ..................... | H01L 29/0649 |
| 10,456,690 B2 * | 10/2019 | Yu et al. .......... | H01L 21/26586 |
| 2003/0003720 A1 * | 1/2003 | Jin et al. ........................ | 438/648 |
| 2012/0032065 A1 * | 2/2012 | Han et al. ....................... | 365/72 |
| 2012/0320655 A1 * | 12/2012 | Han et al. ....................... | 365/72 |
| 2019/0296024 A1 | 9/2019 | Ji et al. | |
| 2019/0296026 A1 * | 9/2019 | Ji et al. ............. | H01L 27/10888 |
| 2020/0020697 A1 * | 1/2020 | Kim et al. ........ | H01L 27/10885 |

* cited by examiner

*Primary Examiner* — Wael M Fahmy
*Assistant Examiner* — Alice W Tang
(74) *Attorney, Agent, or Firm* — Syncoda LLC; Feng Ma

(57) ABSTRACT

A semiconductor structure and a method for manufacturing the same are provided. The semiconductor structure includes: a substrate, bit line structures, and an isolation structure. The substrate includes multiple active areas. The bit line structures are located above the active areas, and include multiple bit lines extending in a first direction parallel to the surface of the substrate and multiple contact plugs electrically connected to the bit lines and the active areas. The isolation structure includes a first insulating layer including a first part and a second part located below the first part, a second insulating layer covering the surface of the second part and a third insulating layer covering at least the surface of the first part. The first part covers at least side walls of the bit lines, and the second part covers at least side walls of the contact plugs.

6 Claims, 11 Drawing Sheets

100          140

208'

—209

1

METHOD TO INSULATE CONTACT PLUG WITH SILICON CARBON OXIDE AND TO INSULATE ABOVE BIT LINE WITH SILICON OXIDE BY OXIDATING SILICON CARBON OXIDE

CROSS-REFERENCE TO RELATED APPLICATION

The present application claims priority to Chinese Patent Application No. 202210759525.8 filed on Jun. 29, 2022, the disclosure of which is hereby incorporated by reference in its entirety.

BACKGROUND

In a semiconductor device, a dielectric material is formed between conductive lines (e.g., bit lines). As the feature size of semiconductor device is becoming smaller and smaller, the distance between conductive lines decreases gradually, as a result, the performance of semiconductor device is reduced.

SUMMARY

Embodiments of the present disclosure relate to the technical field of semiconductors, and in particular to a semiconductor structure and a method for manufacturing the same.

According to the first aspect of the embodiments of the present disclosure, a semiconductor structure is provided, and the semiconductor structure includes: a substrate, bit line structures, and an isolation structure.

The substrate includes a plurality of active areas.

The bit line structures are located above the active areas, and include a plurality of bit lines extending in a first direction and a plurality of contact plugs. The contact plugs are electrically connected to the bit lines and the active areas. The first direction is parallel to a surface of the substrate.

The isolation structure includes a first insulating layer, a second insulating layer and a third insulating layer. The first insulating layer includes a first part and a second part located below the first part. The first part covers at least side walls of the bit lines, and the second part covers at least side walls of the contact plugs. The second insulating layer covers a surface of the second part, and the third insulating layer covers at least a surface of the first part.

According to the second aspect of the embodiments of the present disclosure, a method for manufacturing a semiconductor structure is provided, the method includes the following operations.

A substrate which includes a plurality of active areas is provided.

Bit line structures which are electrically connected to the active areas is formed. The bit line structures include a plurality of bit lines extending in a first direction and a plurality of contact plugs. The contact plugs are electrically connected to the bit lines and the active areas. The first direction is parallel to a surface of the substrate.

An isolation structure which covers the bit line structures is formed. The isolation structure includes a first insulating layer, a second insulating layer and a third insulating layer. The first insulating layer includes a first part and a second part located below the first part. The first part covers at least side walls of the bit lines, and the second part covers at least side walls of the contact plugs. The second insulating layer

2 covers a surface of the second part, and the third insulating layer covers at least a surface of the first part.

DETAILED DESCRIPTION

Figure 1A:
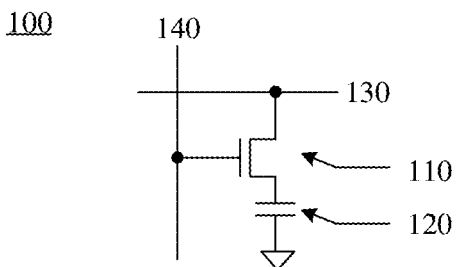
FIG. 1A illustrates a schematic diagram of circuit connection of a memory according to an exemplary embodiment.

The technical solutions of the present disclosure will further be elaborated below in combination with the drawings and the embodiments. Although the exemplary implementation modes of the present disclosure are shown in the drawings, it should be understood that the present disclosure may be implemented in various forms and shall not be limited by the implementation modes described here. Rather, these implementation modes are provided in order to have a more thorough understanding of the present disclosure and to be able to fully convey the scope of the present disclosure to those skilled in the art.

The present disclosure is more specifically described below by means of examples. The advantages and features of the present disclosure will be clearer according to the following specification and claims. It is to be noted that the accompanying drawings are all in a very simplified form with imprecise proportion to assist in illustrating the purpose of the embodiments of the present disclosure easily and clearly.

It is understandable that the meaning of "on", "over" and "above" in the present disclosure should be interpreted in the broadest possible way, so that "on" means not only that an object is on something without intermediate features or layers (that is, the object is directly on something), but also that an object is on something with intermediate features or layers.

Terms "first", "second", "third" and the like in the embodiments of the present disclosure are adopted to distinguish similar objects and not intended to describe a specific sequence or order.

In the embodiments of the present disclosure, term "layer" refers to a material part that includes an area with thickness. The layer may extend over the whole of a lower or upper structure, or may have a scope smaller than the scope of the lower or upper structure. Moreover, the layer may be an area of a homogeneous or heterogeneous continuous structure whose thickness is less than that of a continuous structure. For example, the layer may be between the top surface and the bottom surface of the continuous structure, or the layer may be between any pair of horizontal surfaces at the top surface and bottom surface of the continuous structure. The layer may extend horizontally, vertically and/or along an inclined surface. The layer may include multiple sub-layers.

It is to be noted that the technical solutions recorded in the embodiments of the present disclosure may be freely combined without conflicts.

A dynamic random access memory (DRAM) includes multiple memory cells, each of which includes a transistor (T) and a capacitor (C) coupled to the transistor, that is, the DRAM is 1T1C architecture.

FIG. 1A illustrates a schematic diagram of circuit connection of a memory 100 according to an exemplary embodiment. Referring to FIG. 1A, the source or drain of a transistor 110 is coupled to a bit line 130, the drain or source of the transistor 110 is coupled to a plate of a capacitor 120, the other plate of the capacitor 120 is grounded, and the gate of the transistor 110 is coupled to a word line 140. A voltage is applied to the word line 140 to control the transistor 110 on or off. The bit line 130 is used for performing a read or write operation to the capacitor 120 when the transistor 110 is on. Here, the bit line 130 and the word line 140 are electrically insulating.

As the size of the memory 100 shrinks and the frequency requirement increases, the capacitance value of the capacitor 120 becomes lower and lower. In order to ensure the normal read and write operation of the memory 100, it is necessary to reduce the parasitic capacitance of the bit line 130 as much as possible to ensure the normal sense margin.

Figure 1B:
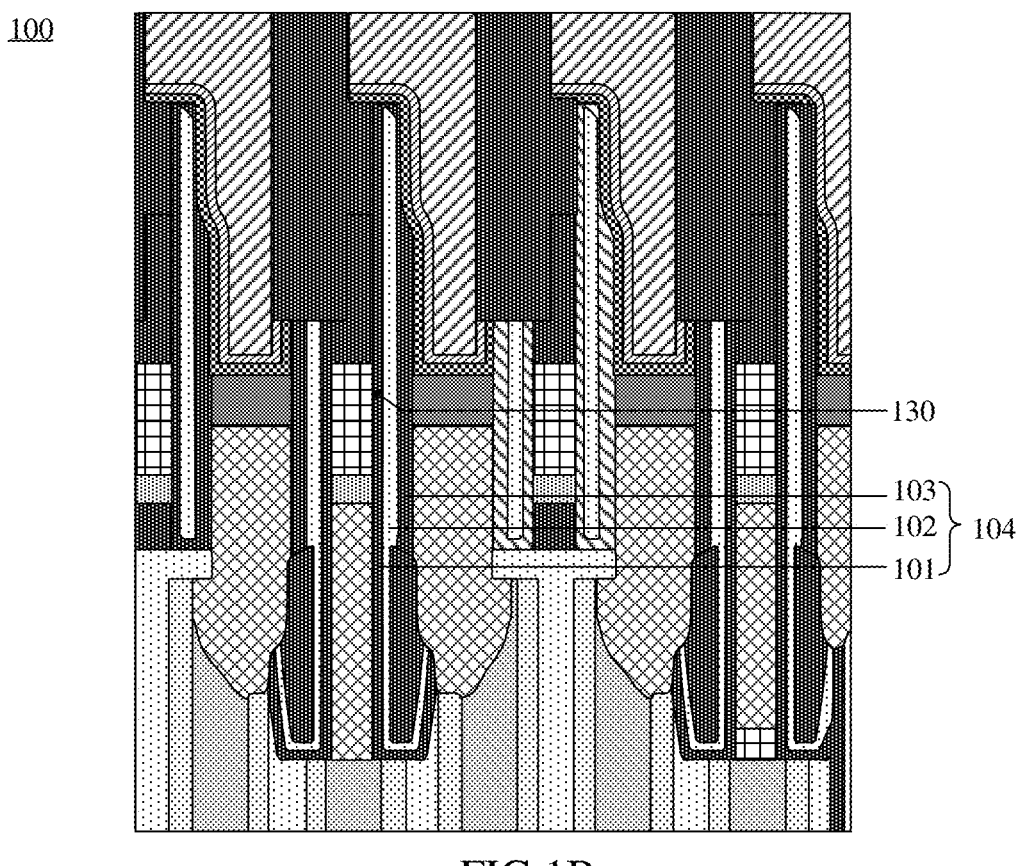
FIG. 1B illustrates a section view of a memory according to an exemplary embodiment.

FIG. 1B illustrates a section view of the memory 100. An isolation structure 104 covers the side wall and top of the bit line 130. The isolation structure 104 includes a composite film layer of silicon nitride layer 101-silicon oxide layer 102-silicon nitride layer 103 (SiN—SiO$_2$—SiN, NON). Because the dielectric constant of silicon nitride is high, the overall dielectric constant of the isolation structure is high, and there is large parasitic capacitance between the bit lines 130, as a result, the sense margin of the memory 100 is reduced, and the normal read and write operation of the memory 100 is influenced.

In view of this, the embodiments of the present disclosure provide a semiconductor structure and a method for manufacturing the same.

Figure 2:
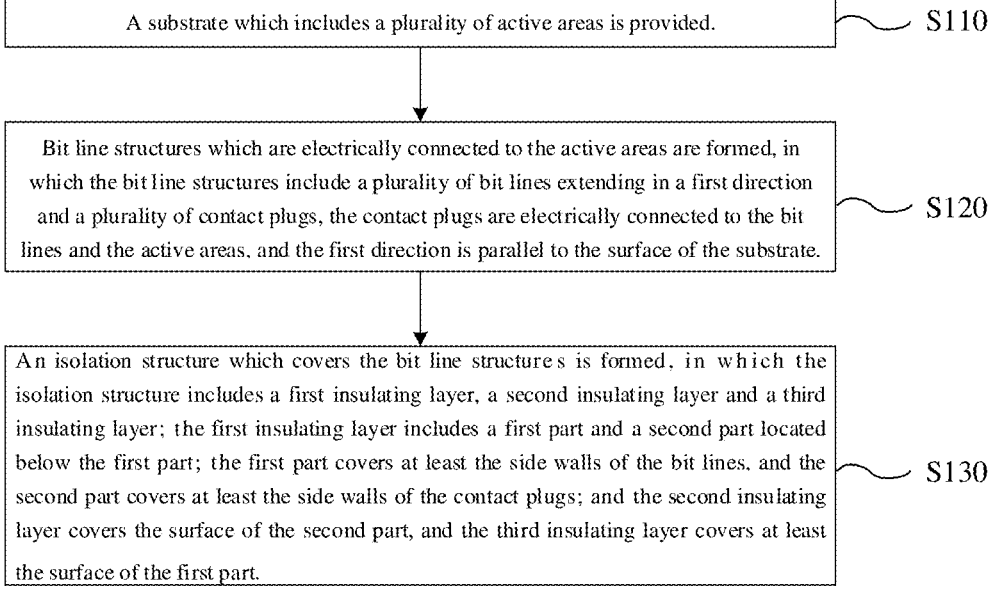
FIG. 2 illustrates a flowchart of a method for manufacturing a semiconductor structure according to an embodiment of the present disclosure.

FIG. 2 illustrates a flowchart of a method for manufacturing a semiconductor structure according to an embodiment of the present disclosure. As shown in FIG. 2, the method may include at least the following operations.

At S110, a substrate which includes a plurality of active areas is provided.

At S120, bit line structures which are electrically connected to the active areas are formed. The bit line structures include a plurality of bit lines extending in a first direction and a plurality of contact plugs. The contact plugs are electrically connected to the bit lines and the active areas. The first direction is parallel to the surface of the substrate.

At S130, an isolation structure which covers the bit line structures is formed. The isolation structure includes a first insulating layer, a second insulating layer and a third insulating layer. The first insulating layer includes a first part and a second part located below the first part. The first part covers at least the side walls of the bit lines, and the second part covers at least the side walls of the contact plugs. The second insulating layer covers the surface of the second part, and the third insulating layer covers at least the surface of the first part.

In the embodiments of the present disclosure, the bit line structures which are electrically connected to the active areas are formed, the bit line structures include a plurality of bit lines extending in the first direction and a plurality of contact plugs, and the isolation structure which covers the bit line structures is formed. Since the isolation structure includes the first insulating layer, the second insulating layer and the third insulating layer, the first part of the first insulating layer covers at least the side walls of the bit lines, and the second part of the first insulating layer covers at least the side walls of the contact plugs, the second insulating layer covers the surface of the second part, and the third insulating layer covers at least the surface of the first part, the overall dielectric constant of the isolation structure can be reduced, which is conductive to reducing the parasitic capacitance between the bit line structures.

Further, because the parasitic capacitance between the bit line structures is reduced, it is conducive to improving a sense margin of the semiconductor structure, and then improving the operating performance of the semiconductor structure.

FIGS. 3 to 9 illustrate schematic diagrams of a process for manufacturing a semiconductor structure according to an embodiment of the present disclosure. The method for manufacturing a semiconductor structure provided by the embodiments of the present disclosure is described in detail below in combination with FIG. 2 and FIG. 3 to FIG. 9.

Figure 3:
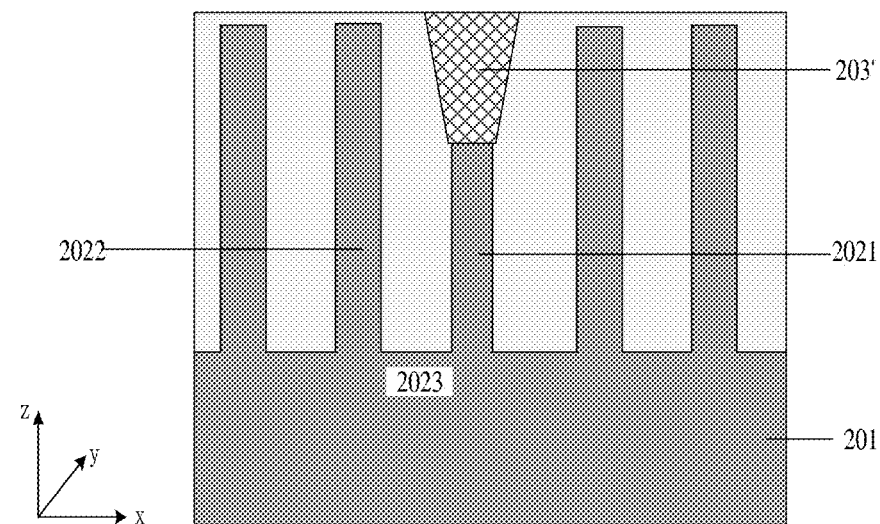
FIGS. 3 to 9 illustrate schematic diagrams of a process for manufacturing a semiconductor structure according to an embodiment of the present disclosure.

Firstly, referring to FIG. 3, S110 is executed, that is, a substrate 201 which includes a plurality of active areas 2021 is provided. The plurality of active areas 2021 may be formed in the substrate 201 by processes such as thin film deposition, etching, and doping.

The thin film deposition process includes, but is not limited to, a chemical vapor deposition (CVD) process, a plasma enhanced chemical vapor deposition (PECVD) process, an atomic layer deposition (ALD) process, or a combination thereof. The etching process includes, but is not limited to, a dry etching process, a wet etching process, or a combination thereof. The doping process includes, but is not limited to, an ion implantation process or an ion diffusion process.

The material of the substrate 201 includes: a single semiconductor material (such as silicon and germanium), a group III-V compound semiconductor material, a group II-VI compound semiconductor material, an organic semiconductor material or other semiconductor materials known in the art.

The material of the active areas 2021 includes a doped semiconductor material, such as doped monocrystalline silicon, doped polycrystalline silicon or doped amorphous silicon. Doped particles of the active areas 2021 include P-type doped particles or N-type doped particles.

Then, S120 is executed, that is, bit line structures 205 electrically connected to the active areas 2021 are formed.

Figure 4:
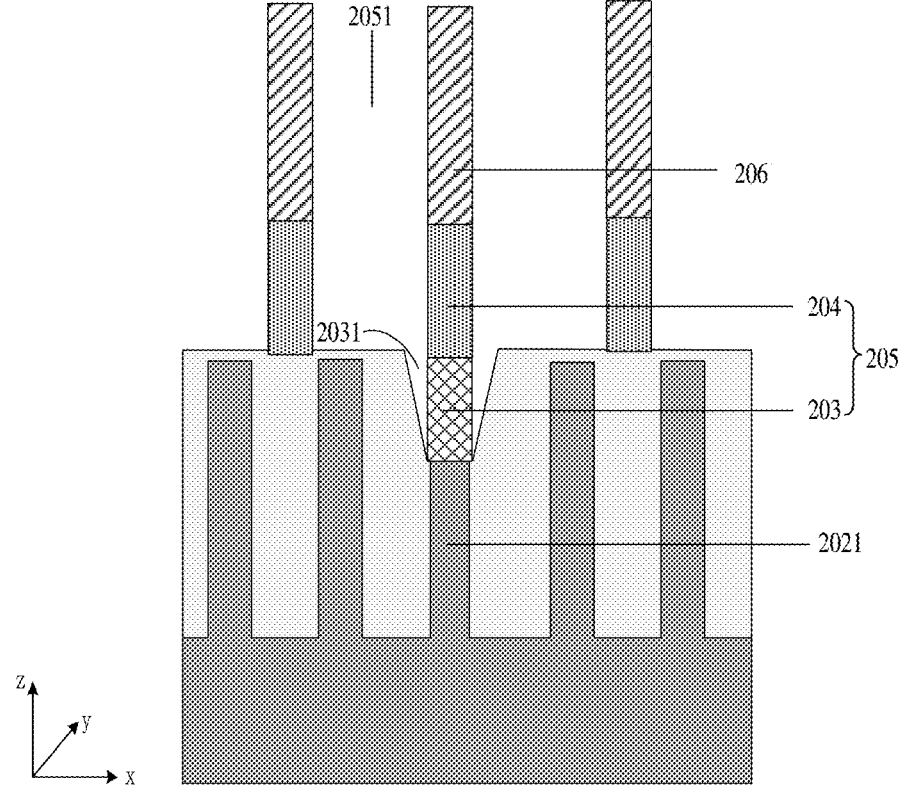

In some embodiments, combined with FIG. 3 and FIG. 4, the above S120 may include the following operations.

The substrate is etched to form a plurality of contact holes, and the contact holes expose the active areas 2021. The contact holes are filled to form conductive contact material layers 203'. Each of the conductive contact material layers 203' has a first surface and a second surface which are set opposite to each other. The first surface is in contact with the active area 2021, and the size of the first surface is smaller than that of the second surface.

A conductive material layer which covers the substrate 201 and the conductive contact material layers 203' is formed.

Part of the conductive material layer is etched to form a plurality of grooves 2051 extending in the first direction. The conductive material layer between two adjacent grooves 2051 forms the bit lines 204.

The conductive contact material layers 203' exposed by the grooves 2051 are etched to form gaps 2031. The remaining conductive contact material layers 203' are the contact plugs 203, and the gaps 2031 are located on two sides of each of the contact plugs 203.

Exemplarily, as shown in FIG. 3, the insulating layer covering the active areas 2021 is etched to form a plurality of contact holes. The bottom of the contact hole exposes the active area 2021, and the size of the bottom of the contact hole is smaller than that of the top of the contact hole. The conductive contact material layers 203' are formed by depositing a conductive contact material into the contact holes. The first surface of the conductive contact material layer 203' is in contact with the active area 2021, and the second surface of the conductive contact material layer 203' is basically flush with the insulating layer.

Exemplarily, the conductive material layer covering the substrate 201 and the conductive contact material layers 203' is formed by the thin film deposition process, and the conductive material layer is etched downward in the z direction to form a plurality of grooves 2051 arranged in parallel along the x direction. The conductive material layer between two adjacent grooves 2051 is the bit line 204, and both the groove 2051 and the bit line 204 extend in the y direction.

It is to be noted that, the first direction, the second direction and the third direction used in the present disclosure represent the y direction, the x direction and the z direction, respectively, both the first direction and the second direction are parallel to the surface of the substrate, the first direction intersects with the second direction, and the third direction is perpendicular to the surface of the substrate, which will not be described hereafter.

Exemplarily, the conductive contact material layers 203' are etched downward through the grooves 2051 to form the gaps 2031, and the remaining conductive contact material layers 203' are used as the contact plugs 203. The gaps 2031 are located on two sides of the contact plug 203, the contact plug 203 is located between the active area 2021 and the bit line 204, and is in contact with the active area 2021 and the bit line 204, respectively. Here, the bit line structures 205 include the contact plugs 203 and the bit lines 204.

In some embodiments, the bit line 204 may be a single film layer, for example, a metal tungsten layer. In some other embodiments, the bit line 204 may also be a composite film layer. In a specific embodiment, the bit line 204 includes a first conductive line and a second conductive line, and the first conductive line is located above the second conductive line, that is, the second conductive line is located between the contact plug 203 and the first conductive line. The material of the first conductive line includes tungsten or molybdenum, and the material of the second conductive line includes titanium nitride. By setting a composite bit line including the first conductive line and the second conductive line, the second conductive line can be used as a blocking layer to prevent the diffusion of the material of the first conductive line and avoid the rise of contact resistance caused by the diffusion of the material of the first conductive line, and thus ensure the stability of the electrical performance of the composite bit line.

In some embodiments, the contact plug 203 may be a single film layer, for example, a polycrystalline silicon layer. In some other embodiments, the contact plug 203 may also be a composite film layer. In a specific embodiment, the contact plug 203 includes a first conductive plug and a second conductive plug, and the first conductive plug is located above the second conductive plug, that is, the first conductive plug is located between the second conductive plug and the bit line 204. Specifically, the first conductive plug is located between the second conductive plug and the second conductive line, the first conductive plug is electrically connected to the second conductive line, and the second conductive plug is electrically connected to the active area 2021. The material of the first conductive plug includes a metal silicide, such as cobalt silicide (CoSi), nickel silicide (NiSi) or titanium silicide (TiSi). The material of the second conductive plug includes a semiconductor material or a doped semiconductor material, such as monocrystalline silicon, polycrystalline silicon, doped monocrystalline silicon or doped polycrystalline silicon. By setting a composite contact plug including the first conductive plug and the second conductive plug, the first conductive plug may be used as a connection layer to reduce the contact resistance between the bit line and the second conductive plug.

Finally, referring to FIG. 2, and FIG. 5 to FIG. 9, S130 is executed, that is, an isolation structure which covers the bit line structure 205 is formed. The isolation structure includes a first insulating layer 207, a second insulating layer 208 and a third insulating layer 209. The first insulating layer 207 includes a first part 207a and a second part 207b located below the first part 207a. The first part 207a covers at least the side wall of the bit line 204, and the second part 207b covers at least the side wall of the contact plug 203. The second insulating layer 208 covers the surface of the second part 207b, and the third insulating layer 209 covers at least the surface of the first part 207a.

In some embodiments, combined with FIG. 2, and FIG. 5 to FIG. 9, the above S130 may include the following operations.

A first insulating material layer 207' is formed. The first insulating material layer 207' covers the surfaces of the gaps 2031, the side walls of the bit line structures 205 and the surface of the substrate 201.

A second insulating material layer 208' is formed. The second insulating material layer 208' covers the surface of the first insulating material layer 207'.

Part of the second insulating material layer 208' is removed and only the second insulating material layer 208' located in the gaps is retained to form the second insulating layer 208.

An oxidation treatment is performed on part of the first insulating material layer 207' to form the first part 207a of the first insulating layer.

A third insulating material layer 209 is formed. The third insulating material layer 209 covers the second insulating layer 208 and the surface of the first part 207a.

Figure 5:
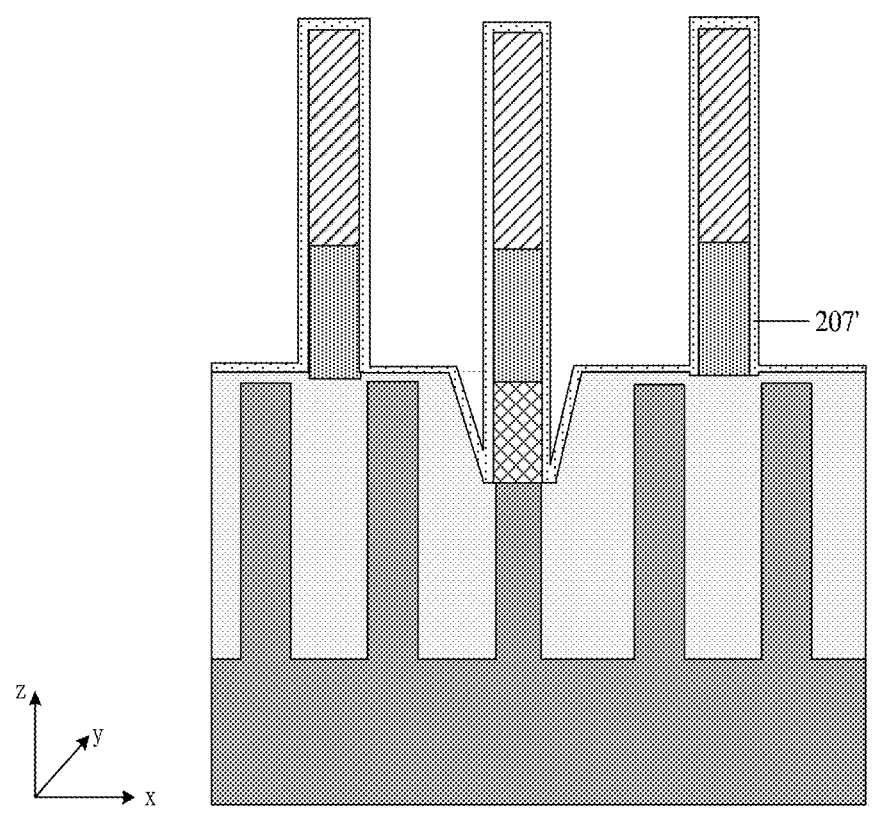
Figure 6:
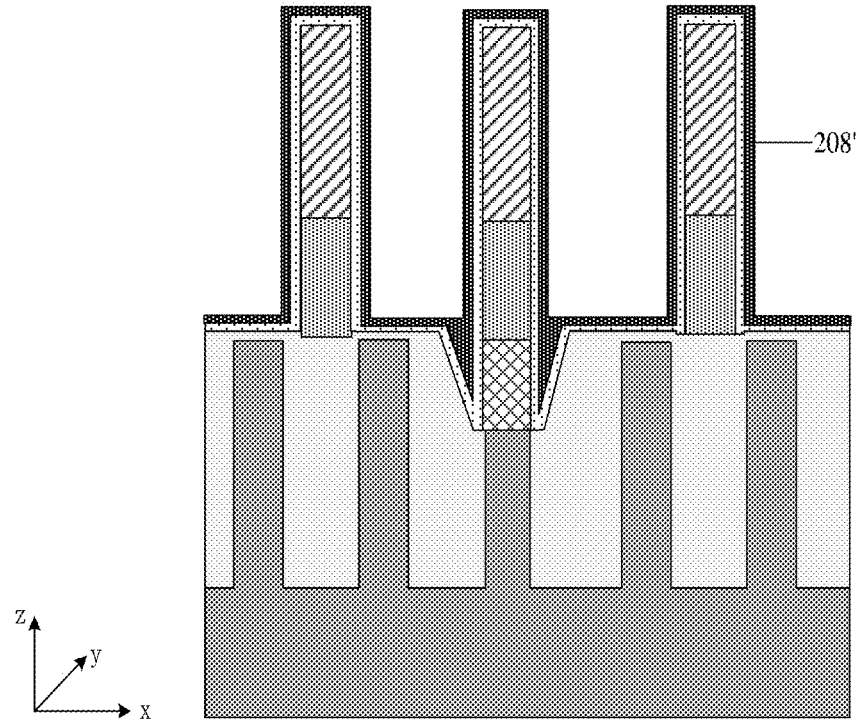

Exemplarily, the first insulating material layer 207' (as shown in FIG. 5) and the second insulating material layer 208' (as shown in FIG. 6) may be formed successively by the thin film deposition process. The first insulating material layer 207' covers the surfaces of the gaps 2031, the side walls of the bit line structures 205, and the surface of the substrate 201. The material of the first insulating material layer 207' includes silicon carbon oxide, for example, silicon carbon oxygen (SiCO). The second insulating material layer 208' covers the first insulating material layer 207'. The material of the second insulating material layer 208' includes any one of a nitride of silicon, silicon nitrogen oxide, or silicon carbon nitride.

Figure 7:
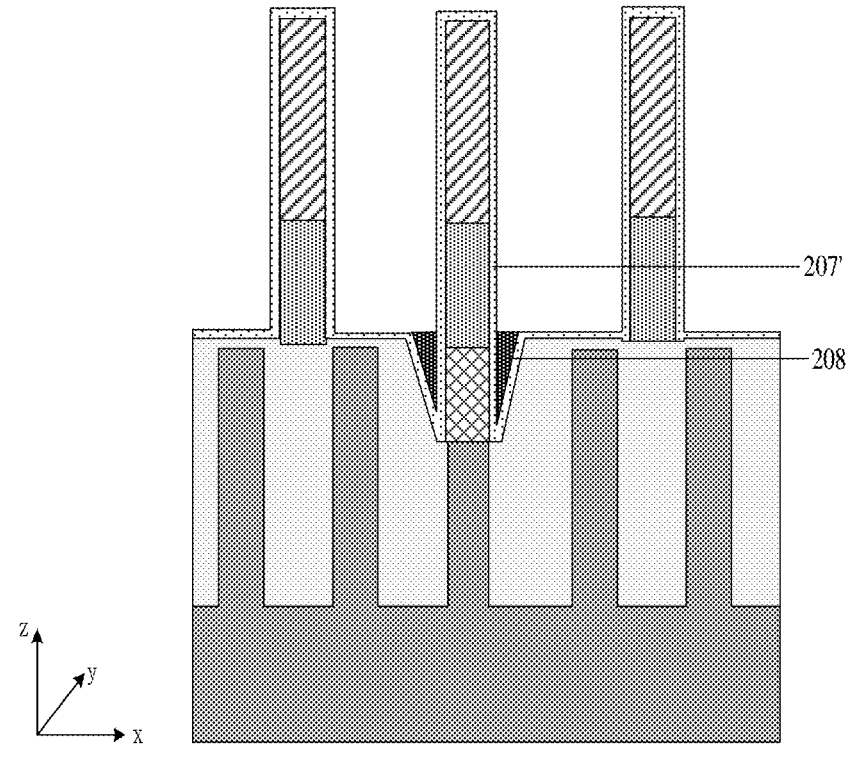

Exemplarily, part of the second insulating material layer 208' may be removed by the etching process to form the structure shown in FIG. 7. As shown in FIG. 7, the remaining second insulating material layer 208' is located in the gaps, denoted as the second insulating layer 208.

Figure 8:
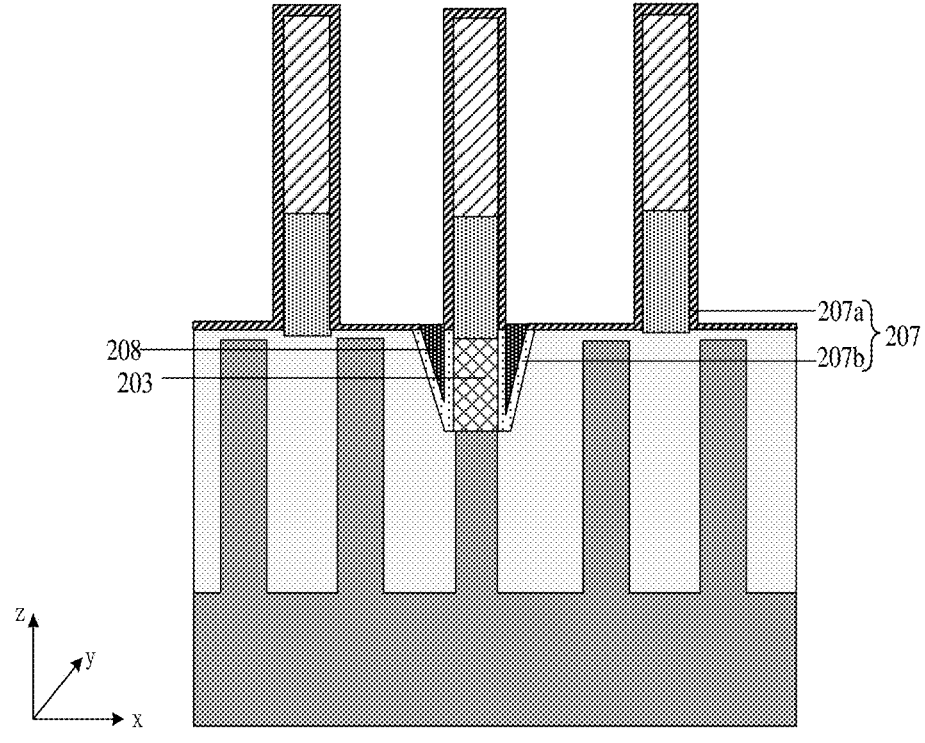

Exemplarily, after the part of the second insulating material layer 208' is removed, the first insulating material layer 207' covering the side walls and tops of the bit lines 204 and the surface of the substrate 201 is exposed. The oxidation treatment is performed on the exposed first insulating material layer 207' to form the first part 207a as shown in FIG. 8, and the unoxidized first insulating material layer 207' is located in the gaps and between the contact plug 203 and the second insulating layer 208, denoted as the second part 207b. Here, the second part 207b and the second insulating layer 208 located in the gaps are used for protecting the contact plugs 203 to reduce the probability that the contact plugs 203 are oxidized. At the same time, the second part 207b located in the gaps is silicon carbon oxide, and the second insulating layer 208 is silicon nitride. An isolation layer formed jointly by the second part 207b and the second insulating layer 208 can better prevent the leakage between a bit line contact plug and a storage node plug compared with the conventional isolation layer formed by a silicon dioxide layer and a silicon nitride layer.

It should be understood that the first insulating layer 207 includes the first part 207a and the second part 207b, and the material of the first part 207a includes an oxide of silicon, for example, silicon oxide. In this example, the dielectric constant of the first part 207a is smaller than the dielectric constant of the second part 207b, and the dielectric constant of the second part 207b is smaller than the dielectric constant of the second insulating layer 208. In a specific example, the first part 207a is silicon oxide with the dielectric constant of 3.9, the second part 207b is silicon carbon oxide with the dielectric constant of 4.5, and the second insulating layer 208 is silicon nitride with the dielectric constant of 7.9.

In some embodiments, the oxidization treatment includes any one or combination of plasma oxidization treatment, thermal oxidization treatment or wet oxidization treatment.

In a specific embodiment, performing an oxidization treatment on the part of the first insulating material layer 207' may include using oxygen plasma to perform the oxidization treatment on the first insulating material layer 207' on the tops and side walls of the bit line structures, and on the surface of the substrate. It is to be noted that the way of using the oxygen plasma to oxidize the first insulating material layer 207' may reduce the oxidization temperature, which is conducive to reducing the consumption of heat.

Figure 9:
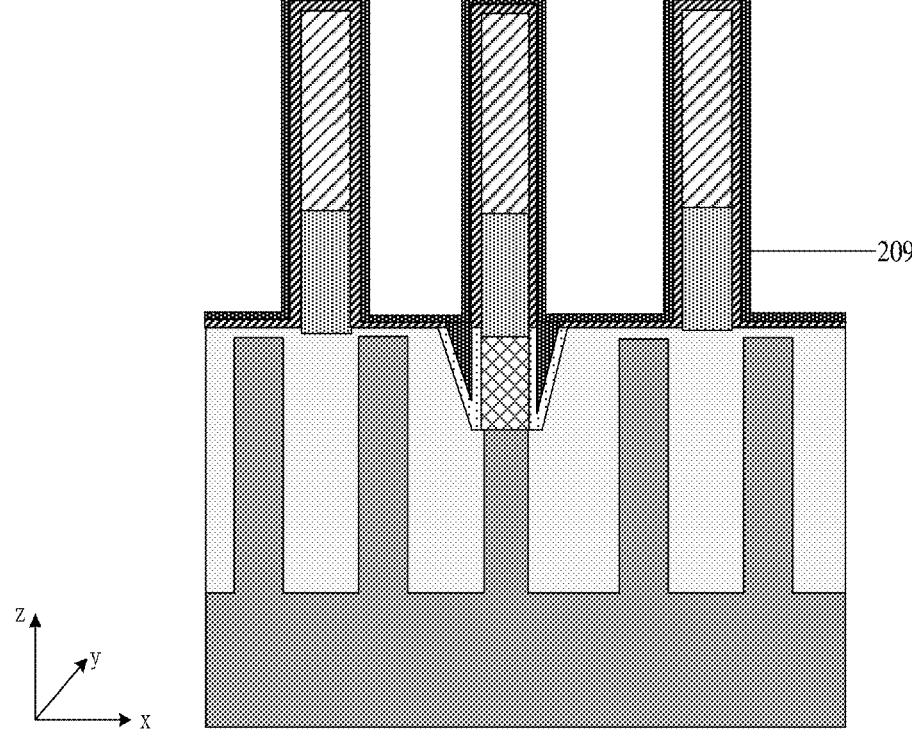

Exemplarily, the third insulating material layer may be formed by the thin film deposition process, denoted as the third insulating layer 209 (as shown in FIG. 9). The third insulating layer 209 covers the second insulating layer 208 and the first part 207a. The material of the third insulating layer 209 includes any one of a nitride of silicon, silicon nitrogen oxide, or silicon carbon nitride. In a specific example, the material of the third insulating layer 209 is the same as that of the second insulating layer 208.

In the embodiments of the present disclosure, by depositing successively the first insulating material layer and the second insulating material layer, and then removing part of the second insulating material layer to expose the first insulating material layer covering the side walls and tops of the bit lines, and performing the oxidation treatment on the first insulating material layer, the first part whose dielectric constant is smaller than that of the first insulating material layer can be formed, which is conductive to reducing the overall dielectric constant of the isolation structure, and thus reducing the parasitic capacitance between the bit lines.

In addition, the manufacturing method provided by the embodiments of the present disclosure can form a composite isolation structure including the first insulating layer, the second insulating layer and the third insulating layer, which is conducive to improving the electrical isolation performance of the isolation structure and reducing the probability of leakage in the semiconductor structure.

Moreover, the second part and the second insulating layer located in the gaps can protect the contact plugs during oxidization treatment and reduce the probability that the contact plugs are oxidized, which is conductive to ensuring the stability of the electrical performance of the contact plugs.

In some embodiments, before the first insulating material layer 207' is formed, the manufacturing method may also include forming a protective layer 206.

The protective layer 206 covers the surface, away from the substrate 201, of each of the bit lines 204.

Exemplarily, a conductive material layer and a protective material layer covering the substrate 201 and the conductive contact material layers 203' may be formed by the thin film deposition process, and the protective material layer and the conductive material layer are etched downward along the z direction to form the grooves 2051 shown in FIG. 4. The protective material layer between two adjacent grooves 2051 is the protective layers 206. The material of the protective layer 206 includes any one of a nitride of silicon, silicon nitrogen oxide, or silicon carbon nitride, for example, silicon nitride. In a specific example, the material of the protective layer 206 is the same as that of the second insulating layer 208.

In the embodiments of the present disclosure, by forming the protective material layer covering the conductive material layer, the protective material layer can protect the conductive material layer and reduce the damage of the etching process to the conductive material layer, which is conductive to ensuring the electrical performance of the bit lines.

In some embodiments, as shown in FIG. 3, the substrate 201 also includes a channel region 2023, which is located between the first active area 2021 and the second active area 2022. The above method may also include the following operations.

A gate dielectric layer and a word line structure located in the substrate 201 are formed. The gate dielectric layer is located between the word line structure and the channel region 2023. The word line structure extends in the second direction. The second direction is parallel to the surface of the substrate, and the second direction intersects with first direction.

A second contact plug coupled to the second active area 2022 is formed on the second active area 2022.

Exemplarily, the first active area 2021 and the second active area 2022 may be formed in the substrate 201 by the thin film deposition process, the etching process, the doping process, etc. The second active area 2022 includes a doped semiconductor material, such as doped monocrystalline silicon, doped polycrystalline silicon or doped amorphous silicon. The doped particles of the second active area 2022 include the P-type doped particles or the N-type doped particles.

The first active area 2021 may be used as the source or drain of the transistor, the second active area 2022 may be used as the drain or source of the transistor, and the part of the substrate located between the first active area 2021 and the second active area 2022 may be used as the channel region 2023 of the transistor.

Exemplarily, a gate dielectric layer (not shown in the figure) covering the first active area 2021, the second active area 2022, and the channel region 2023 is formed, and a gate layer covering the gate dielectric layer is formed. The gate layer may be used as a control gate of the transistor to control the transistor on or off. A word line (not shown in the figure) extending along the direction parallel to the x axis is formed, and the word line is coupled to the gate layer. Here, the word line structure includes the gate layer and the word line.

The preparation process of the second contact plug coupled to the second active area 2022 may be similar to the preparation process of the contact plug 203 mentioned above, so it will not be repeated.

In some embodiments, the method may also include that: a capacitor electrically connected to the second contact plug is formed. The capacitor includes a first plate, an inter-plate dielectric layer and a second plate. The second contact plug is electrically connected to the second active area 2022 and the first plate.

Exemplarily, the capacitor (not shown in the figure) electrically connected to the second contact plug may be formed by the processes, such as thin film deposition, lithography, and etching. The material of the first plate and the second plate includes a conductive material, such as tungsten, platinum, copper, titanium and aluminum. The material of the inter-plate dielectric layer may be a dielectric material, for example, silicon oxide. The material of the inter-plate dielectric layer may also be a ferroelectric material, for example, hafnium oxide or chromium oxide.

Figure 10:
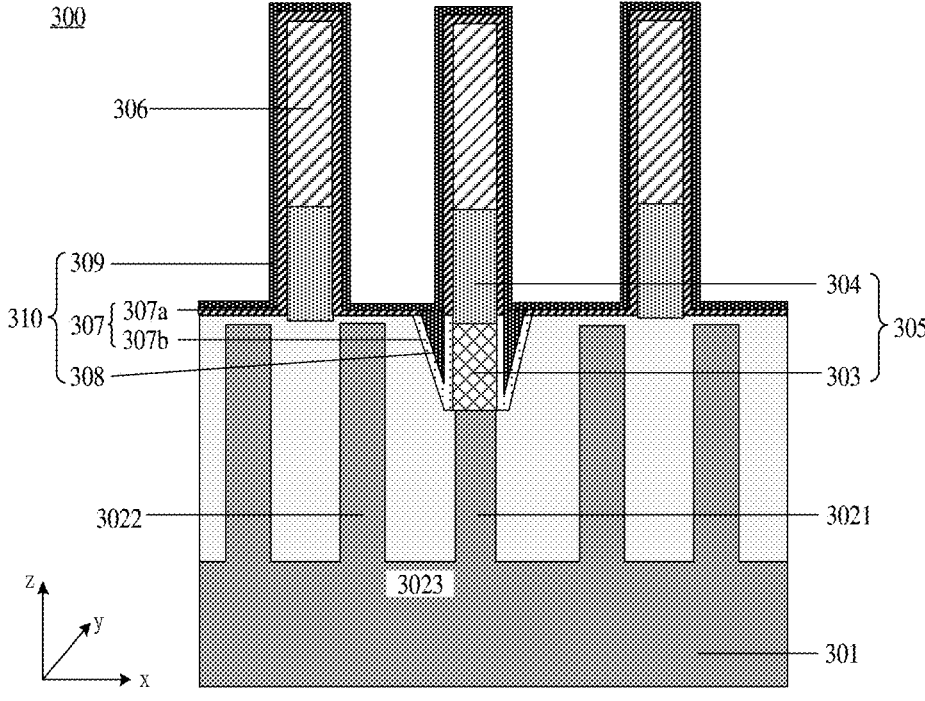
FIG. 10 illustrates a structure diagram of a semiconductor structure according to an embodiment of the present disclosure.

FIG. 10 illustrates a schematic structure diagram of a semiconductor structure 300 according to an embodiment of the present disclosure. As shown in FIG. 10, the semiconductor structure 300 may include: a substrate 301, bit line structures 305, and an isolation structure 310.

The substrate 301 includes a plurality of active areas 3021.

The bit line structures 305 are located above the active areas 3021, and include bit lines 304 extending in the first direction and a plurality of contact plugs 303. The contact plugs 303 are electrically connected to the bit lines 304 and the active areas 3021. The first direction is parallel to a surface of the substrate 301.

The isolation structure 310 includes a first insulating layer 307, a second insulating layer 308 and a third insulating layer 309. The first insulating layer 307 includes a first part 307*a* and a second part 307*b* located below the first part 307*a*. The first part 307*a* covers at least side walls of the bit lines 304, and the second part 307*b* covers at least side walls of the contact plugs 303. The second insulating layer 208 covers a surface of the second part 307*b*, and the third insulating layer 309 covers at least a surface of the first part 307*a*.

The material of the substrate 301 includes: a single semiconductor material (such as silicon and germanium), a group III-V compound semiconductor material, a group II-VI compound semiconductor material, an organic semiconductor material or other semiconductor materials known in the art.

The material of the active area 3021 includes a doped semiconductor material, such as doped monocrystalline silicon, doped polycrystalline silicon or doped amorphous silicon. The doped particles of the active area 3021 include the P-type doped particles or the N-type doped particles.

The material of the contact plug 303 includes a semiconductor material or a doped semiconductor material, such as monocrystalline silicon, polycrystalline silicon, doped monocrystalline silicon or doped polycrystalline silicon.

The bit line 304 extends along the y direction. In some embodiments, the bit line 304 may be a single film layer, for example, a metal tungsten layer. In some other embodiments, the bit line 304 may also be a composite film layer. In a specific embodiment, the bit line 304 includes a first conductive line and a second conductive line, and the first conductive line is located above the second conductive line, that is, the second conductive line is located between the contact plug 303 and the first conductive line. The material of the first conductive line includes tungsten or molybdenum, and the material of the second conductive line includes titanium nitride. By setting a composite bit line including the first conductive line and the second conductive line, the second conductive line can be used as a blocking layer to prevent the diffusion of the material of the first conductive line and avoid the rise of contact resistance caused by the diffusion of the material of the first conductive line, and thus ensure the stability of the electrical performance of the composite bit line.

In some embodiments, the contact plug 303 may be a single film layer, for example, a polycrystalline silicon layer. In some other embodiments, the contact plug 303 may also be a composite film layer. In a specific embodiment, the contact plug 303 includes a first conductive plug and a second conductive plug, and the first conductive plug is located above the second conductive plug, that is, the first conductive plug is located between the second conductive plug and the bit line 304. Specifically, the first conductive plug is located between the second conductive plug and the second conductive line, the first conductive plug is electrically connected to the second conductive line, and the second conductive plug is electrically connected to the active area 3021. The material of the first conductive plug includes a metal silicide, such as cobalt silicide (CoSi), nickel silicide (NiSi) or titanium silicide (TiSi). The material of the second conductive plug includes a semiconductor material or a doped semiconductor material, such as monocrystalline silicon, polycrystalline silicon, doped monocrystalline silicon or doped polycrystalline silicon. By setting the composite contact plug including the first conductive plug and the second conductive plug, the first conductive plug may be used as a connection layer to reduce the contact resistance between the bit line and the second conductive plug.

The isolation structure 310 covers the bit line structures 305. Specifically, the isolation structure 310 includes the first insulating layer 307, the second insulating layer 308 and the third insulating layer 309. The first insulating layer 307 includes the first part 307*a* and the second part 307*b* located below the first part 307*a*, the second part 307*b* covers the side walls of the contact plugs 303, the second insulating layer 308 covers the surface of the second part 307*b*, and the first part 307*a* covers the side walls and tops of the bit lines 304 and the surface of the substrate 301. The third insulating layer 309 covers the surface of the first part 307*a* and the second insulating layer 308. In an example, the top surface of the second insulating layer 308 is basically flush with the top surface of the first part 307*a* covering the surface of the substrate 301.

The material of the first part 307*a* includes an oxide of silicon, for example, silicon oxide. The material of the second part 307*b* includes silicon carbon oxide, for example, silicon carbon oxygen (SiCO). The materials of the second insulating layer 308 and the third insulating layer 309 include any one of a nitride of silicon, silicon nitrogen oxide, or silicon carbon nitride, for example, silicon nitride. In some embodiments, the materials of the second insulating layer 308 and the third insulating layer 309 are the same. In some other embodiments, the materials of the second insulating layer 308 and the third insulating layer 309 are different.

In the embodiments of the present disclosure, the isolation structure is set, the isolation structure includes the first insulating layer, the second insulating layer and the third insulating layer, and the first insulating layer includes the first part and the second part located below the first part. Since the first part covers the side walls of the bit lines, the second part covers the side walls of the contact plugs, the second insulating layer covers the surface of the second part, and the third insulating layer covers at least the surface of the first part, the overall dielectric constant of the isolation structure can be reduced, which is conducive to reducing the parasitic capacitance between the bit line structures.

Further, since the parasitic capacitance between the bit line structures is reduced, it is conducive to improving the sense margin of the semiconductor structure, and then improving the operating performance of the semiconductor structure.

In some embodiments, the dielectric constant of the second part 307b is greater than that of the first part 307a, and the dielectric constant of the second insulating layer 308 and the third insulating layer 309 is greater than that of the second part 307b.

In a specific example, the first part 307a is silicon oxide with the dielectric constant of 3.9, the second part 307b is silicon carbon oxide with the dielectric constant of 4.5, and the second insulating layer 308 and the third insulating layer 309 are silicon nitride with the dielectric constant of 7.9.

In the embodiments of the present disclosure, by setting the dielectric constant of the second part greater than the dielectric constant of the first part, that is, the dielectric constant of the first part covering the side walls and tops of the bit lines is less than that of the second part covering the side walls of the contact plugs, it is conducive to reducing the parasitic capacitance between the bit lines.

In addition, by setting the composite isolation structure including the first insulating layer, the second insulating layer and the third insulating layer, it is conducive to improving the electrical isolation performance of the isolation structure and reducing the probability of leakage in the semiconductor structure.

In some embodiments, the thickness of the first insulating layer 307 ranges from 4 nanometers to 8 nanometers.

In some embodiments, as shown in FIG. 10, the semiconductor structure 300 may also include: a protective layer 306. The protective layer 306 covers the surface, away from the substrate 301, of each of the bit lines 304. The first part 307a also covers the surface of the protective layer 306.

In the embodiments of the present disclosure, by setting the protective layer covering the bit line, the protective layer can protect the bit line and reduce the damage of the manufacturing process to the bit line, which is conducive to ensuring the electrical performance of the bit line.

In some embodiments, the semiconductor structure 300 may also include: a channel region 3023, a second contact plug, a word line structure, and a gate dielectric layer.

The channel region 3023 is located between the first active area 3021 and the second active area 3022.

The second contact plug is located on the second active area 3022 and is coupled to the second active area 3022.

The word line structure is located in the substrate 301 and extends in the second direction. The second direction is parallel to the surface of substrate 301, and intersects with the first direction.

The word line structure covers the channel region 3023.

The gate dielectric layer is located between the word line structure and the channel region 3023.

The material of the second active area 3022 includes a doped semiconductor material, such as doped monocrystalline silicon, doped polycrystalline silicon or doped amorphous silicon. The doped particles of the second active area 3022 include the P-type doped particles or the N-type doped particles.

The first active area 3021 may be used as a source or a drain of a transistor, the second active area 3022 may be used as the drain or source of the transistor, and part of the substrate located between the first active area 3021 and the second active area 3022 may be used as the channel region 3023 of the transistor.

The gate dielectric layer (not shown in the figure) covers the first active area 3021, the second active area 3022 and the channel region 3023. The gate layer (not shown in the figure) covers the gate dielectric layer, and may be used as the control gate of the transistor to control the transistor on or off. The word line (not shown in the figure) extends along the direction parallel to the x axis and is coupled to the gate layer. Here, the word line structure includes the gate layer and the word line.

In some embodiments, the semiconductor structure 300 may also include a capacitor.

The capacitor includes a first plate, an inter-plate dielectric layer and a second plate. The second contact plug is electrically connected to the second active area 3022 and the first plate.

The second contact plug (not shown in the figure) is located between the second active area 3022 and the capacitor (not shown in the figure) and is used for electrically connecting the second active area 3022 and the capacitor. The material of the second contact plug may be the same as the material of the contact plug 303, and will not be repeated here.

The materials of the first plate and the second plate include the conductive materials, such as tungsten, platinum, copper, titanium and aluminum. The material of the inter-plate dielectric layer may be a dielectric material, for example, silicon oxide. The material of the inter-plate dielectric layer may also be a ferroelectric material, for example, hafnium oxide or chromium oxide.

The above is only the specific implementation modes of the disclosure and not intended to limit the protection scope of the disclosure. Any change or replacement that those skilled in the art can think of easily in the scope of technologies disclosed by the disclosure shall fall within the protection scope of the disclosure. Therefore, the scope of protection of the present disclosure shall be subject to the scope of protection of the claims.

The invention claimed is:

1. A method for manufacturing a semiconductor structure, comprising:

providing a substrate comprising an active area;

forming a bit line structure electrically connected to the active area; wherein the bit line structure comprises a bit line extending in a first direction parallel to a surface of the substrate and a contact plug electrically connected to the bit line and the active area;

forming silicon carbon oxide covering a top surface and side walls of the bit line structure;

forming a second insulating material layer with a dielectric constant greater than a dielectric constant of the silicon carbon oxide covering a surface of the silicon carbon oxide;

removing part of the second insulating material layer, wherein remaining part of the second insulating material forms a second insulating layer and covers the surface of the silicon carbon oxide covering side walls of the contact plug;

performing an oxidation treatment on part of the silicon carbon oxide not covered by the second insulating layer to form silicon oxide, wherein the silicon oxide forms a first part of a first insulating layer and covers side walls of the bit line, and remaining part of the silicon carbon oxide covers as a second part of the first insulating layer and covers the side walls of the contact plug; and forming a third insulating material layer covering a top surface of the second insulating layer and side walls of the first part.

2. The method of claim 1, wherein forming the bit line structure electrically connected to the active area comprises:

etching the substrate to form a contact hole exposing the active area, and filling the contact hole to form a conductive contact material layer; wherein the conductive contact material layer has a first surface and a second surface opposing each other; the first surface is in contact with the active area, and a size of the first surface is smaller than a size of the second surface;

forming a conductive material layer covering the substrate and the conductive contact material layer;

etching part of the conductive material layer to form a groove extending in the first direction; wherein the conductive material layer between two adjacent grooves forms the bit line; and etching the conductive contact material layer exposed by the groove to form a gap; wherein the remaining conductive contact material layer forms the contact plug, and the gap is located on two sides of the contact plug.

3. The method of claim 2, wherein the silicon carbon oxide covers the gap, the side walls of the bit line structure, and the surface of the substrate; the second insulating layer located in the gap.

4. The manufacturing of claim 3, wherein performing an oxidation treatment on part of the silicon carbon oxide not covered by the second insulating layer to form silicon oxide comprises: performing the oxidation treatment on the silicon carbon oxide on the top surface and the side walls of the bit line structure, and on the surface of the substrate by using oxygen plasma.

5. The method of claim 3, wherein materials of the second insulating material layer and the third insulating material layer comprise any one of silicon nitride, silicon nitrogen oxide, or silicon carbon nitride.

6. The method of claim 3, wherein before forming the silicon carbon oxide, the method further comprises:

forming a protective layer, which covers a surface, away from the substrate, of the bit line.

* * * * *